(12) United States Patent
Na et al.

(10) Patent No.: US 9,462,686 B2
(45) Date of Patent: Oct. 4, 2016

(54) PRINTED CIRCUIT BOARD

(71) Applicant: LG INNOTEK CO., LTD., Seoul (KR)

(72) Inventors: Se Woong Na, Seoul (KR); Min Jae Kim, Seoul (KR); Hyun Gyu Park, Seoul (KR); In Hee Cho, Seoul (KR); Man Hue Choi, Seoul (KR); Seung Kwon Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 99 days.

(21) Appl. No.: 14/319,648

(22) Filed: Jun. 30, 2014

(65) Prior Publication Data

US 2015/0008017 A1    Jan. 8, 2015

(30) Foreign Application Priority Data

Jul. 2, 2013    (KR) .................. 10-2013-0077312

(51) Int. Cl.
*H05K 1/00*    (2006.01)
*H05K 1/02*    (2006.01)
*H05K 3/00*    (2006.01)

(52) U.S. Cl.
CPC ............ *H05K 1/028* (2013.01); *H05K 3/0058* (2013.01); *H05K 2201/056* (2013.01)

(58) Field of Classification Search
CPC ............ H05K 1/028; H05K 2201/05; H05K 2201/056; H05K 3/0058
USPC ........................................ 174/254; 361/749
See application file for complete search history.

(56) References Cited

U.S. PATENT DOCUMENTS

| | | | |
|---|---|---|---|
| 6,927,344 B1 * | 8/2005 | Gall | H05K 1/0278 174/254 |
| 7,450,398 B2 * | 11/2008 | Oh | H05K 1/148 361/749 |
| 2005/0056457 A1 * | 3/2005 | Gall | H05K 1/0281 174/254 |
| 2009/0032295 A1 * | 2/2009 | Okajima | H05K 1/0203 174/260 |

\* cited by examiner

*Primary Examiner* — Sherman Ng
(74) *Attorney, Agent, or Firm* — Saliwanchik, Lloyd & Eisenschenk

(57) ABSTRACT

Provided is a printed circuit board, comprising: a supporting substrate including a first region and a second region extending to be bent from the first region; an insulating substrate above the supporting substrate; a bending portion bent between the first region and the second region; and an adhesive layer between the supporting substrate and the insulating substrate and except for the bending portion.

17 Claims, 5 Drawing Sheets

PRINTED CIRCUIT BOARD

CROSS-REFERENCE TO RELATED APPLICATION

This application claims the benefit under 35 U.S.C. §119 Korean Patent Application No. 10-2013-0077312, filed on Jul. 2, 2013, which is hereby incorporated by reference in its entirety.

BACKGROUND

1. Technical Field

Embodiments of the present invention relate to a printed circuit board.

2. Related Arts

A liquid crystal display (LCD) has no self-luminous which can make its own light, and thus a separate lighting device is needed for all liquid crystal display devices. Such a lighting device serves as a light source of the liquid crystal display device, and a backlight unit (BLU) refers to a complex composed of a light source itself for irradiating light to a rear surface of a liquid module, a force circuit for driving the light source, and all components for enabling uniform flat light to be formed.

The liquid crystal display device becomes gradually thin, and accordingly, a reduction in a bezel width of the liquid crystal display device has been needed. As one example, in order to reduce the bezel width, the structure of a printed circuit board on which light emitting elements are mounted, or the structure of a lighting device including a light guide plate for guiding light generated from the light emitting devices has been changed.

However, as the structure of the printed circuit board becomes thin, it is problematic in that wirings connected to the light emitting elements are damaged, or layers constituting the printed circuit board are separated from each other. Accordingly, ways to thinly change the structure of the printed circuit board while protecting the wirings of the printed circuit board from being damaged have been practically needed.

BRIEF SUMMARY

An aspect of embodiments of the present invention may provide a circuit board which is configured such that when an adhesive layer is formed between an insulating substrate and a supporting substrate, the adhesive layer is formed only in a region except for a bending portion between a first region and a second region extending to be bent from the first region so that the insulating substrate or the adhesive layer can be prevented from be separated from the supporting substrate upon forming the bending portion.

Another aspect of embodiments of the present invention may provide a circuit board which is configured such that a through hole is formed at a position corresponding to a spaced portion between light emitting elements in a supporting substrate so that a connector is mounted to a region to which the light emitting elements are mounted, thereby reducing a width of the supporting substrate.

A further aspect of embodiments of the present invention may provide a circuit board which is configured such that a region of an insulating substrate corresponding to a bending portion is formed to have wrinkles in consideration of force applied when the bending portion is formed so that light emitting elements and wirings connected to the light emitting elements can be prevented from being damaged, and at the same time, the bending portion can be effectively formed.

Yet another aspect of embodiments of the present invention may provide a circuit board which is configured such that a bending portion of a supporting substrate corresponding to wrinkles of an insulating substrate is formed in an intaglio or relief structure so that the insulating substrate can be prevented from being separated from the supporting substrate upon forming the bending portion.

According to an aspect of the embodiments of the present invention, a circuit board may include: a supporting substrate including a first region and a second region extending to be bent from the first region; an insulating substrate above the supporting substrate; a bending portion between the first region and the second region; and an adhesive layer between the supporting substrate and the insulating substrate except for the bending portion.

According to another aspect of the embodiments of the present invention, a circuit board may include: a supporting substrate including a first region and a second region; an insulating substrate above the supporting substrate; and an adhesive layer formed between the insulating substrate and the supporting substrate to bond the insulating substrate and the supporting substrate, wherein the insulating substrate has wrinkles so that the second region can extend to be bent from the first region.

The insulating substrate may have wrinkles with a predetermined angle in a region corresponding to the bending portion.

A part of the supporting substrate may be removed in a shape corresponding to the bending portion.

A thickness of the supporting substrate corresponding to the bending portion may be smaller than that of the supporting substrate of the first region and the second region.

At this time, the adhesive layer may have the same area as that of each of the first region and the second region.

The printed circuit board may further include a filling material layer formed by filling the bending portion with the same material as a material which constitutes the insulating substrate.

The printed circuit board may further include a filling material layer formed by filling the bending portion with a different material from the material which constitutes the insulating substrate.

The wrinkles may have a larger roughness than that of the first region and the second region.

The wrinkles may include a bending guide portion configured to guide bending of the insulating substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
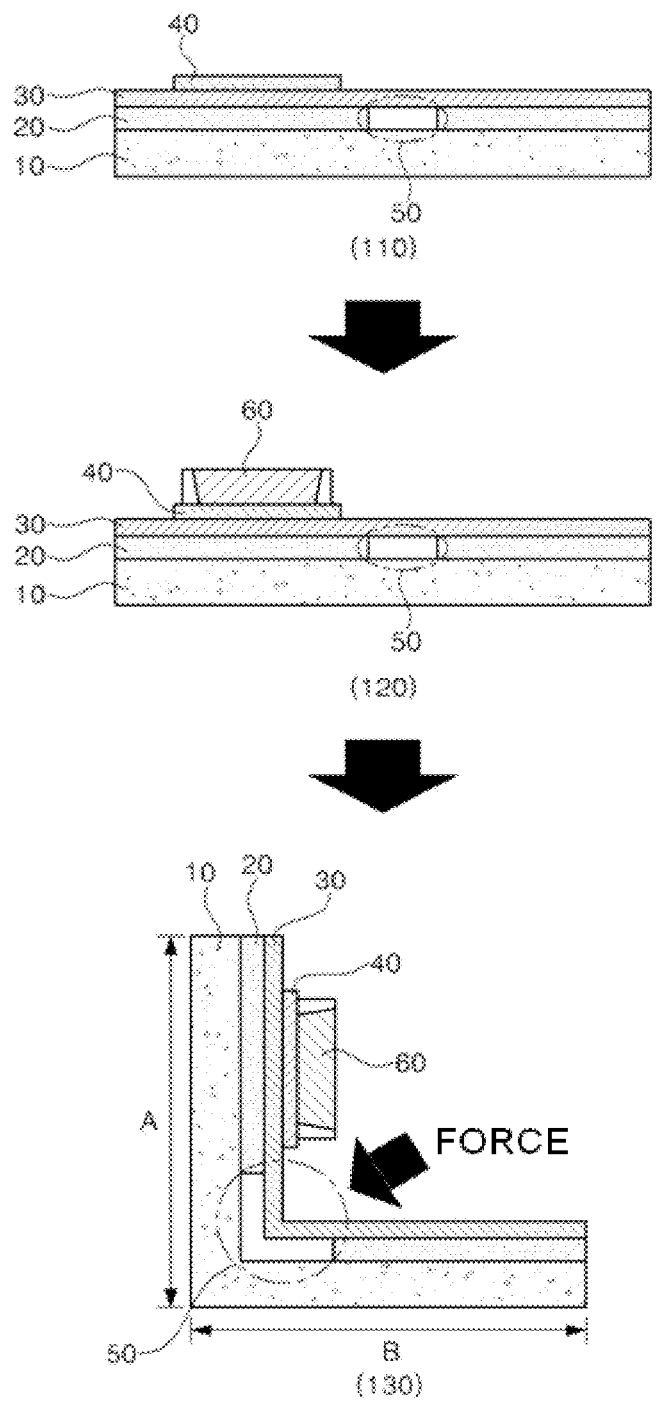
FIG. 1 is a view illustrating a printed circuit board according to one embodiment of the present invention.

Hereinafter, the configurations and operations according to embodiments of the present invention will be described in detail with reference to the accompanying drawings. The present invention may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

FIG. 1 is a view illustrating a printed circuit board according to one embodiment of the present invention.

Referring to FIG. 1, a printed circuit board 110 includes: a supporting substrate 10 having a first region A and a second region B extending to be bent from the first region A; an insulating substrate 30 above the supporting substrate 10; a bending portion 50 between the first region A and the second region B; and an adhesive layer 20 between the supporting substrate 10 and the insulating substrate 30 except from the bending portion 50.

A printed circuit board 120 is formed by mounting light emitting elements 60 to the first region A of the insulating substrate 30. When force is applied to the bending portion 50 of the printed circuit board 120, a printed circuit board 130 in which a bending portion 50 is bent 130 is formed.

The term "bending" or "bent" in the present specification may refer to wide meanings including a meaning wherein a flat substrate is bent or warped, and thus being deformed, a meaning wherein a deformed part is wrinkled or folded, and thus being deformed, and a meaning wherein a part to be deformed has different roughness in advance or deformation is performed by a bending guide portion formed in advance.

In a conventional printed circuit board, when the supporting substrate 10, the adhesive layer 20 and the insulating substrate 30 are laminated in order, and the bending portion 50 is formed in a state of the light emitting elements 60 being mounted, it is problematic in that the adhesive layer 20 or the insulating substrate 30 of the bending portion 50 is separated from the supporting substrate 10.

Accordingly, in order to solve the problem that the adhesive layer 20 or the insulating substrate 30 of the bending portion 50 is separated from the supporting substrate 10, in the present embodiment of the invention, when the adhesive layer 20 is formed, the adhesive layer 20 may not be formed in the bending portion 50 to be bent, but may be formed only in a region corresponding to the first region A and the second region B which remain except for the bending portion 50.

As an example, the printed circuit board 130 may be configured such that a vacant space is formed in a bending portion (a bending portion inside the adhesive layer) in which the adhesive layer 20 is not formed.

According to the present embodiment of the invention, even when the printed circuit board 130 is bent, the bending portion 50 of the adhesive layer 20 is formed as a vacant space, so that a space capable of receiving a part of the insulating substrate having deformation caused by bending can be provided. Accordingly, despite the fact that the printed circuit board 130 is bent, the adhesive layer 20 or the insulating substrate 30 may be prevented from being excited from the supporting substrate 10 by strong force or heat, and the adhesive layer 20 or the insulating substrate 30 may be also prevented from being separated from the supporting substrate.

Figure 2:
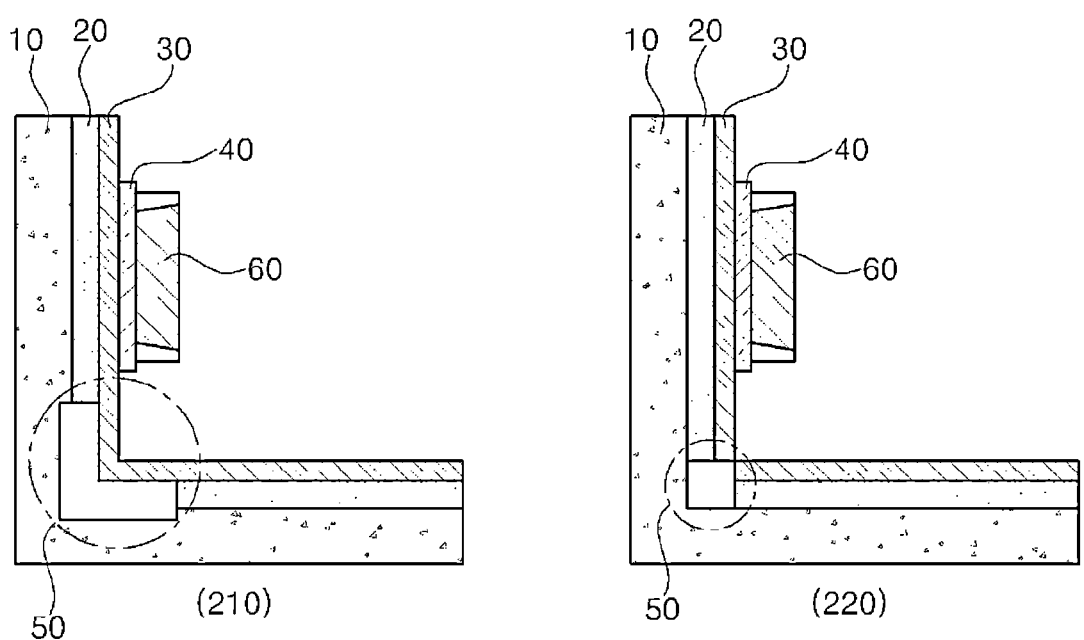
FIG. 2 is a view illustrating modified examples of the printed circuit board of FIG. 1.

FIG. 2 is a view illustrating modified examples 210, 220 of the embodiment illustrated in FIG. 1.

According to one modified example of the embodiment, it may be provided with the circuit board 210 which is configured such that a part of the supporting substrate 10 is removed in a shape corresponding to the bending portion 50 in which the adhesive layer 20 is not formed. According to the one modified example, a space in which the insulating substrate 30 is received may extend up to the bending portion and the removing part of the supporting substrate, and thanks to a reduction in a thickness of the supporting substrate 10, the printed circuit board 210 may be bent by only a small external force, thereby enabling the bending of the printed circuit board 210 to more easily be performed. Since the thickness of the supporting substrate 10 corresponding to the bending portion 50 becomes smaller than that of the supporting substrate 10 of the first region and the second region, the bending of the printed circuit board 210 may be easily performed.

Meanwhile, according to another modified example of the embodiment, it can be provided with a circuit board 220 in which a part of the insulating substrate 30 placed at a position corresponding to the bending portion 50 is removed so that the insulating substrate 30 corresponding to the first region A and the insulating substrate 30 corresponding to the second region B can be spaced apart from each other.

At this time, the adhesive layer 20 may have the same area as that of each of the insulating substrate 30 corresponding to the first region A and the insulating substrate 30 corresponding to the second region B. according to such another modified example of the embodiment, it can be provided with the circuit board having a further elaborate combination upon the bending of the circuit board 220.

Figure 3:
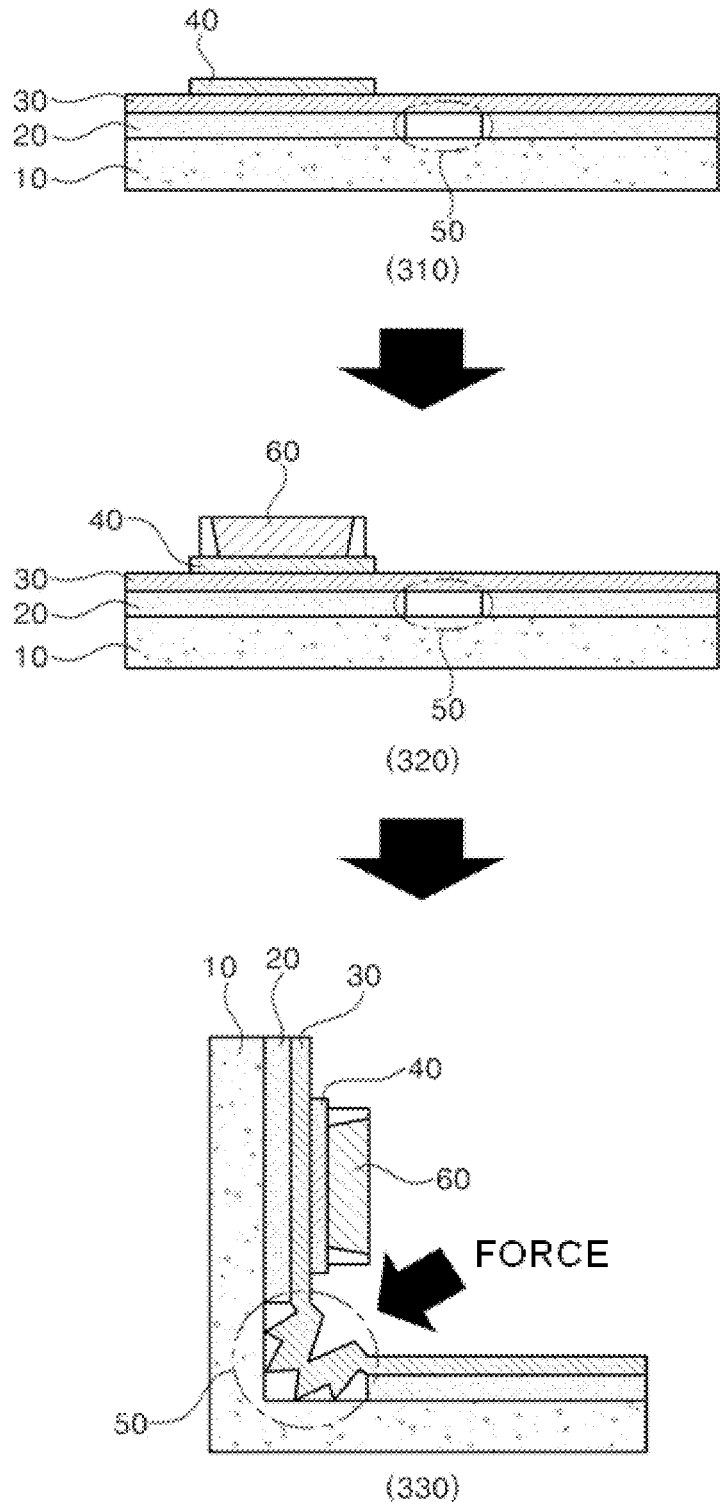
FIG. 3 is a view illustrating a printed circuit board including wrinkles.

FIG. 3 is a view illustrating printed circuit boards 310, 320, 330 including wrinkles.

Referring to FIG. 3, the printed circuit board 310 includes: the supporting substrate 10 including a first region A and a second region B extending to be bent from the first region A; the insulating substrate 30 above the supporting substrate 10; the bending portion 50 between the first region A and the second region B; and the adhesive layer 20 between the supporting substrate 10 and the insulating substrate 30 except for the bending portion 50. Here, the insulating substrate 30 may have wrinkles in a region corresponding to the bending portion 50.

FIG. 3 illustrates an example in which bending of the wrinkles are generated two times, but in the present embodiment, the number of times the bending being generated is not limited to two times, and the present embodiment may also include an example in which the bending may be generated three or more times. The printed circuit board 320 is formed by mounting the light emitting elements 60 to the first region of the insulating substrate 30. When force is applied to the bending portion 50 of the printed circuit board 320, the printed circuit board 330 in which the bending portion 50 is bent is formed.

The reason why the insulating substrate 30 has the wrinkles are because the adhesive layer 20 of the bending portion is vacant, and thus the insulating substrate is also bent when the bending portion 50 is bent by force. At this time, as illustrated in FIG. 3, the wrinkles according to the present embodiment may be received in the bending portion 50.

The circuit board 330 according to the present embodiment is configured such that the insulating substrate 30 corresponding to the bending portion 50 has the wrinkles so that the adhesive layer 20 or the insulating substrate 30 can be prevented from being separated from the supporting substrate 10 by strong force of heat.

In one embodiment, the printed circuit board 330 may be configured such that the insulating substrate 30 is formed in the bending portion (the bending portion within the adhesive layer) in which the adhesive layer 20 is not formed.

Meanwhile, the printed circuit board 330 according to a modified example of one embodiment may further include a filling material layer formed by filling the bending portion (the bending portion within the adhesive layer) in which the adhesive layer 20 is not formed with the same material as a material which constitutes the insulating substrate 30, or by filling a different material from a material which constitutes the adhesive layer 20, even though this is not illustrated in FIG. 3. In this regard, the description will be performed in greater detail in the section relating to FIG. 5.

Figure 4:
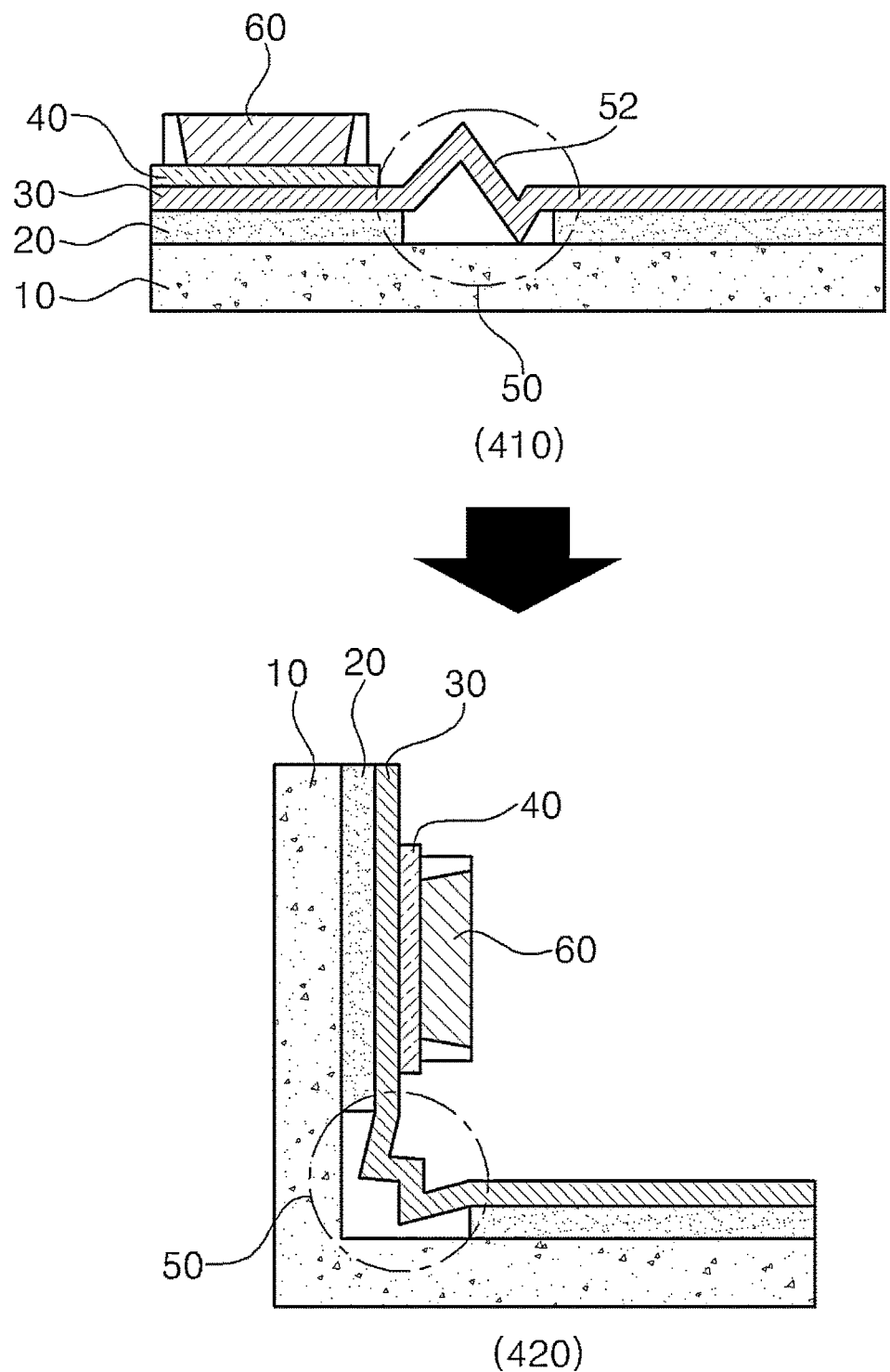
FIG. 4 is a view illustrating modified examples of the wrinkles of FIG. 3.

FIG. 4 is a view illustrating modified examples of the wrinkles of FIG. 3.

Referring to FIG. 4, the insulating substrate 30 may have wrinkles at a position corresponding to the bending portion 50 (410) before the printed circuit board 410 has been bent.

The wrinkles according to the present embodiment may be configured such that roughness of the insulating substrate 30 located at a position corresponding to the bending portion 50 is larger than that of the insulating substrate 30 corresponding to the first region A and the second region B, or a bending guide portion 52 configured to guide bending of the substrate is included in the insulating substrate 30 located at the position corresponding to the bending portion 50 in advance.

Accordingly, after bending or by bending, the wrinkles of the insulating substrate 30 may invade a region of the bending portion 50 having no adhesive layer 20 (420). That is, the insulating substrate 30 may be formed in the bending portion 50 in which the adhesive layer 20 is not present.

Figure 5:
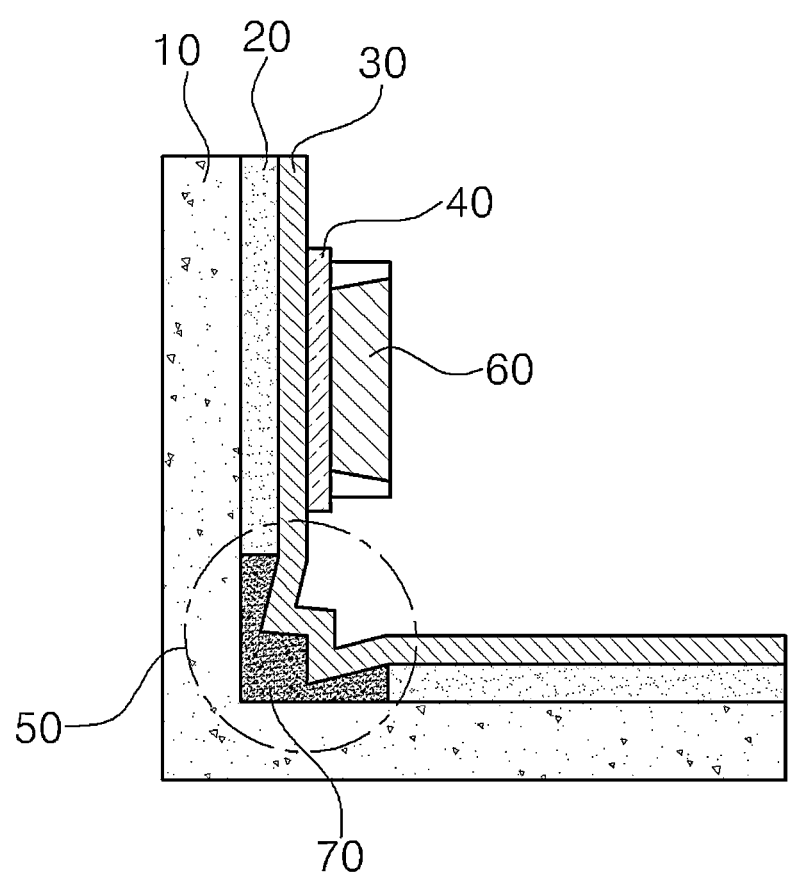
FIG. 5 is a view illustrating a printed circuit board including a filling material layer.

FIG. 5 is a view illustrating a printed circuit board including a filling material layer. That is, the printed circuit boards illustrated in FIG. 5 shows a modified example in which a vacant space of the bending portion 50 is filled with a filling material.

The printed circuit boards illustrated in FIG. 5 may include a filling material layer 70 formed by filling the bending portion 50 in which the adhesive layer 20 is not formed with the same material as a material which constitutes the supporting substrate, or a filling material layer 70 formed by filling the bending portion with a different material from a material which constitutes the supporting substrate.

The filling material layer 70 of the modified example as illustrated in FIG. 5 may be modified in a shape corresponding to the wrinkles of the printed circuit board even when the substrate is bent to form the bending portion 50. In this case, like the case in which the bending portion 50 is the vacant space, the insulating substrate 30 and the supporting substrate 10 can be prevented from being separated from each other.

The printed circuit board 30 as described above may include: the light emitting elements 60 mounted to the first region A of the insulating substrate 30; a mounting layer 40 configured to mount the light emitting elements 60; and the pad portion including pad wirings connected to the light emitting elements 60; and the string portion including string wirings configured to transmit electrical signals to the light emitting elements 60.

For example, the mounting layer 40 may be made of Cu. Also, the pad portion may be formed in the first region A to which the light emitting elements 60 are mounted, and the string portion may be formed in the second region B.

As set forth above, according to one embodiment of the present invention, when the adhesive layer is formed between the insulating substrate and the supporting substrate, the adhesive layer is formed only in a region except for the bending portion between the first region and the second region extending to be bent from the first region, so that the insulating substrate or the adhesive layer can be prevented from being separated from the supporting substrate upon forming the bending portion.

According to one embodiment of the present invention, the region of the insulating substrate corresponding to the bending portion is formed to have wrinkles in consideration of force applied upon forming the bending portion, so that the wirings connected between the light emitting elements can be prevented from being damaged, and at the same time, the bending portion can be effectively formed.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A printed circuit board, comprising:
a supporting substrate including a first region and a second region extending to be bent from the first region;
an insulating substrate on the supporting substrate;
a bending portion between the first region and the second region; and
an adhesive layer between the supporting substrate and the insulating substrate except for the bending portion;
wherein the insulation substrate has wrinkles in a region corresponding to the bending portion, and the wrinkles are received in the bending portion.

2. The printed circuit board of claim 1, wherein a part of the supporting substrate is removed in a shape corresponding to the bending portion.

3. The printed circuit board of claim 1, wherein a thickness of the supporting substrate corresponding to the bending portion is smaller than that of the supporting substrate of the first region and the second region.

4. The printed circuit board of claim 3, wherein the adhesive layer has the same area as that of each of the first region and the second region.

5. The printed circuit board of claim 1, further comprising a filling material layer formed by filling the bending portion with the same material as a material which constitutes the insulating substrate.

6. The printed circuit board of claim 1, further comprising a filling material layer formed by filling the bending portion with a different material from the material which constitutes the insulating substrate.

7. The printed circuit board of claim 1, wherein the wrinkles have a larger roughness than that of the first region and the second region.

8. The printed circuit board of claim 1, wherein the wrinkles comprise a bending guide portion configured to guide bending of the insulating substrate.

9. A printed circuit board, comprising:
- a supporting substrate including a first region and a second region;
- an insulating substrate above the supporting substrate; and
- an adhesive layer formed between the insulating substrate and the supporting substrate to bond the insulating substrate and the supporting substrate,
- wherein the insulating substrate has wrinkles so that the second region can extend to be bent from the first region, and
- wherein the wrinkles are received in a bending portion formed between the first region and the second region.

10. The printed circuit board of claim 9, wherein the adhesive layer is formed at a position corresponding to each of the first region and the second region to be separated by the bending portion.

11. The printed circuit board of claim 9, wherein a part of the supporting substrate is removed in a shape corresponding to the bending portion.

12. The printed circuit board of claim 9, wherein a thickness of the supporting substrate corresponding to the bending portion is smaller than that of the supporting substrate of the first region and the second region.

13. The printed circuit board of claim 12, wherein the adhesive layer has the same area as that of each of the first region and the second region.

14. The printed circuit board of claim 9, further comprising a filling material layer formed by filling the bending portion with the same material as a material which constitutes the supporting substrate or the insulating substrate.

15. The printed circuit board of claim 9, further comprising a filling material layer formed by filling the bending portion with a different material from the material which constitutes the adhesive layer.

16. The printed circuit board of claim 9, wherein the wrinkles have a larger roughness than that of the first region and the second region.

17. The printed circuit board of claim 9, wherein the wrinkles comprise a bending guide portion configured to guide bending of the insulating substrate.

\* \* \* \* \*